United States Patent [19]

Kwon et al.

[11] Patent Number: 4,950,622

[45] Date of Patent: Aug. 21, 1990

[54] METHOD FOR MANUFACTURING A SURFACE EMITTING TYPE ALGAAS/GAAS SEMICONDUCTOR LASER DIODE

[75] Inventors: Young Se Kwon; Tae Kyung Yoo, both of Seoul, Rep. of Korea

[73] Assignee: Korea Advanced Institute of Science and Technology, Seoul, Rep. of Korea

[21] Appl. No.: 344,317

[22] Filed: Apr. 27, 1989

[30] Foreign Application Priority Data

Apr. 28, 1988 [KR] Rep. of Korea ............................ 4868

[51] Int. Cl.[5] ............................................. H01L 21/20
[52] U.S. Cl. ............................ 437/129; 148/DIG. 26; 148/DIG. 95; 156/613; 372/50; 437/81; 437/89; 437/133; 437/970
[58] Field of Search .................... 148/DIG. 26, 51, 56, 148/65, 72, 95, 104, 110, 169; 156/610–615; 357/16, 17; 427/248.1, 252, 255.1; 372/43, 45, 46, 50; 437/81, 89, 90, 111, 126, 127, 129, 133, 904, 905, 948, 962, 970

[56] References Cited

U.S. PATENT DOCUMENTS

| | | | |
|---|---|---|---|
| 4,718,070 | 1/1988 | Liau et al. | 372/50 |
| 4,784,722 | 11/1988 | Liau et al. | 156/649 |
| 4,865,684 | 9/1989 | Bouadma | 437/129 |
| 4,869,780 | 7/1989 | Yang et al. | 437/129 |
| 4,881,237 | 11/1989 | Donnelly | 372/50 |

FOREIGN PATENT DOCUMENTS

| | | | |
|---|---|---|---|
| 0164591 | 10/1982 | Japan | 372/50 |
| 0165777 | 8/1985 | Japan | 372/50 |
| 0263185 | 11/1986 | Japan | 372/50 |
| 0106686 | 5/1987 | Japan | 372/50 |

OTHER PUBLICATIONS

Comerford et al., "Offset Laser to Groove Waveguide Coupler", IBM TDB, vol. 20, No. 4, Sep. 1977, pp. 1606–1608.
Donnelly et al., "Monolithic Two-Dimensional Surface-Emitting Arrays of . . . Lasers", Appl. Phys. Lett., 51(15), Oct. 12, 1987, pp. 1138–1140.
Azoulay et al., "Selective MOCVD Epitaxy for Optoelectronic Devices", J. Crystal Growth, vol. 55, No. 1, Oct. 1981, pp. 229–234.
Iga et al., ". . . GaAlAs/GaAs Surface Emitting Injection Laser", Appl. Phys. Lett. 45(4), Aug. 15, 1984, pp. 348–350.
Windhorn et al., "Monolithic GaAs/AlGaAs Diode Laser/Reflector Devices . . . ", Appl. Phys. Lett., 48(24), Jun. 16, 1986, pp. 1675–1677.

*Primary Examiner*—Brian E. Hearn
*Assistant Examiner*—William D. Bunch
*Attorney, Agent, or Firm*—Darby & Darby

[57] ABSTRACT

A method for manufacturing a surface emitting type AlGaAs/GaAs semiconductor LASER diode by a selective epitaxy method which is capable of forming naturally a 45° mirror reflective face during the epitaxy method itself. The method comprises the steps of forming a silicon oxide or silicon nitride layer on one side of a n-type single crystal GaAs substrate as a mask, removing the mask of the regions each for forming a 45° mirror reflective face and a LASER diode by use of a photolithography and a chemicaletching, forming the two layers by removing the photoresistor on the remaining mask after a selective epitaxy process and converting a slant face of the LASER diode into a vertical face, depositing a n-type metal layer on the other side of the substrate, and carrying out a heat treatment.

3 Claims, 3 Drawing Sheets

METHOD FOR MANUFACTURING A SURFACE EMITTING TYPE ALGAAS/GAAS SEMICONDUCTOR LASER DIODE

BACKGROUND OF THE INVENTION

The present invention relates to a method for manufacturing a surface emitting type AlGaAs/GaAs semiconductor LASER diode by a selective epitaxy method, and more particularly to a manufacturing method of a surface emitting type AlGaAs/GaAs semiconductor LASER diode which is capable of forming naturally a 45° mirror reflective face during the epitaxy process itself at the time of manufacturing a semiconductor LASER diode.

In general, since a semiconductor LASER diode is capable of forming two-dimensional array it can obtain an enormously large output more than that of one-dimensional array of edge emitting type LASER diode. Consequently, the surface emitting type semiconductor LASER diode can be widely used in the high speed signal transmission between semiconductor elements having the integration capacity more than that of VLSI (Very Large Scale Integration).

However, there has been some difficulties in manufacturing the surface emitting type element in case of AlGaAs/GaAs which is the typical kind of semiconductor LASER diode.

For example, according to a prior art method known from J. P. Donnelly et al., Appl. Phys. Lett., 51, pp. 1138, Oct., 1987, it utilizes 45° mirror reflective face for the purpose of turning a beam emitted from an edge toward the surface, while it has to adopt a IBAE (Ion Beam Assisted Etching) method in order to manufacture the 45° mirror reflective face, thereby giving rise to the problems that the equipment of high price is required and the yields thereof become low.

According to another prior art method suggested by K. Mitsunaga et al., Appl. Phys. Lett., 50, pp. 1788, June, 1987, it also implicates the disadvantages in that since a grating has to be formed on a layer of AlGaAs the output thereof becomes low due to the oxidation of AlGaAs layer, the uniformity of grating and the dispersion of light.

According to the other prior art method suggested by K. Iga et al., Appl. Phys. Lett., 45, pp. 348, Aug., 1987, it needs two expitaxy processes and thus the process becomes complicated, and since the reflective properties of the mirror reflective face becomes low the properties of element are not good.

SUMMARY OF THE INVENTION

Therefore, it is an object of the present invention to provide a manufacturing method of a surface emitting type semiconductor LASER diode which is capable of forming naturally a 45° mirror reflective face during the epitaxy process itself which is an essential process in manufacturing a semiconductor LASER diode.

The object of the present invention is attained by forming on one side of a n-type single crystal GaAs substrate a silicon oxide film or a silicon nitride film for a mask, removing said mask on the regions each for forming a 45° mirror reflective face and a LASER diode by making use of a photolithography method and a chemicaletching method, thereafter forming a 45° mirror reflective face and a LASER diode by removing only the remaining photoresistor on the mask through a selective epitaxy method in the above two regions, depositing a p-type metal layer on the above layers, forming a slant face of the LASER diode into a vertical face by making the p-type metal layer as a mask, and manufacturing a surface emitting type AlGaAs/GaAs semiconductor LASER diode having two semiconductor diodes and a 45° mirror reflective face as a basic unit by carrying out a heat treatment by depositing a n-type metal layer on the other side of said n-type single crystal GaAs substrate.

In the above, the width of the region for forming the 45° mirror reflective face is 10–50 μm, and the width of the region for forming the LASER diode is 200–1000 μm.

Moreover, when forming the 45° mirror reflective face of a triangle during the selective epitaxy process, the angle of the mirror reflective face is obtained by utilizing the phenomenon that the GaAs layer formed on the triangular AlGaAs layer is collapsed by a mass transport during the epitaxy process.

BRIEF DESCRIPTION OF THE DRAWINGS

The above and other objects, features and advantages of the present invention will become more apparent from the following detailed description taken in conjunction with the accompanying drawings, in which.

DETAILED DESCRIPTION OF THE INVENTION

The procedure of the manufacturing process for AlGaAs/GaAs semiconductor LASER diode according to a preferred embodiment of the present invention will be described in accordance with FIGS. 1.

Figure 1A:
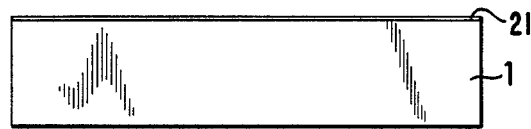
FIG. 1A to FIG. 1E are explanatory views showing the process for manufacturing a semiconductor LASER diode according to the present invention.
Figure 1B:
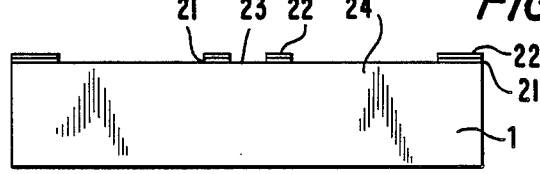

At first, as shown in FIG. 1A a silicon oxide film or a silicon nitride film 21 is formed with a deposition on a n-type single crystal GaAs substrate 1 to a thickness of about 2000Å by a CVD (Chemical Vapor Deposition Method) or a sputtering so as to be a mask, thereafter as shown in FIG. 1B the mask is removed so that a region for forming a 45° mirror reflective face 23 having a width of 10–50 μm and a region for forming a LASER diode 24 having a width of 200–1000 μm are formed by making use of a photolithography method and a chemicaletching process using a photoresister 22. At this moment, between the two regions 23 and 24 each for forming a 45° mirror reflective face and a LASER diode a mask having a width of 5–20 μm is in existence.

Figure 1C:
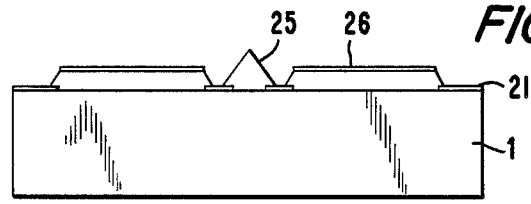

Thereafter, as shown in FIG. 1C only the photoresistor 22 is removed and a triangular 45° mirror reflective face 25 and two LASER diodes 26 are formed through a selective epitaxy process. In the above, in each crystal layer of the 45° mirror reflective face 25 and LASER diodes 26 a n-type clad layer of $Al_yGa_{l-y}As$, a p-type active layer of $Al_xGa_{l-x}Al$, a p-type clad layer of $Al_y$-$Ga_{l-y}As$ and a cap layer of GaAs are laminated in turn.

Wherein, an important thing in the procedure for manufacturing the semiconductor LASER according to the embodiment of the present invention is the epitaxy process in which the multilayer of AlGaAs and GaAs is formed on the GaAs substrate, and this process will now be described in more detail.

Figure 2:
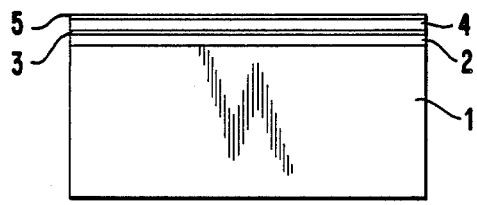
FIG. 2 is a sectional view of a crystal layer after an epitaxy process for a semiconductor LASER diode.

Such an epitaxy process of a multilayer is a double heterogeneous junction, in case of using a n-type single crystal substrate, as shown in FIG. 2 a n-type clad layer 2 of $Al_yGa_{l-y}As$, a p-type active layer 3 of $Al_yGa_{l-x}As$ which emits the light, a p-type clad layer of $Al_yGa_{l-y}As$ 4 and a p-type cap layer of GaAs 5 are laminated in turn on the n-type single crystal substrate 1. (Wherein $0 \leq x \leq 0.15$, $y \simeq x + 0.3$).

Figure 3:
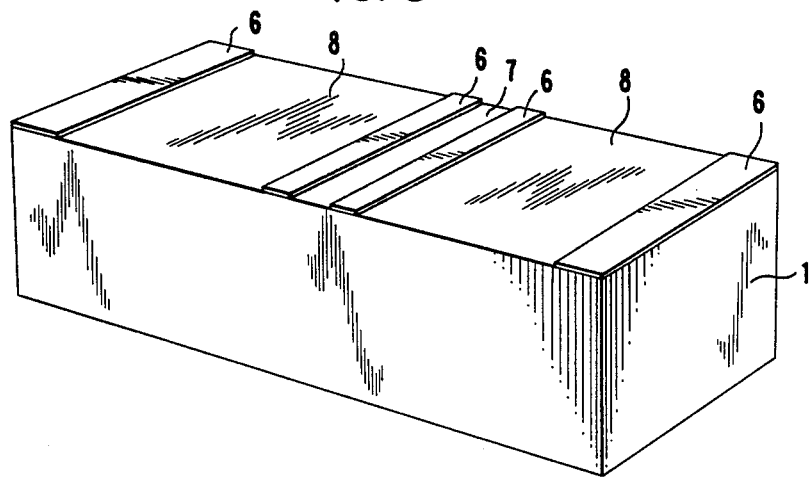
FIG. 3 is an exemplary view of a GaAs single crystal substrate coated with a mask to be used in a selective epitaxy process of the present invention.

Prior to the epitaxy process as above, as shown in FIG. 3 two regions for forming two LASER diodes 8 are formed on the n-type single crystal substrate 1 by using a mask 6 of a silicon oxide layer or a silicon nitride layer, and between the two regions 8 a region for forming a 45° mirror reflective face is also formed on the n-type single crystal substrate 1 in the same manner, and when the epitaxy process is carried out a crystal is selectively laminated on the regions 7 and 8 where the mask is removed, while the layer of AlGaAs and GaAs is not laminated on the portion that the mask 6 of the silicon oxide layer or the silicon nitride layer exists.

Figure 4:
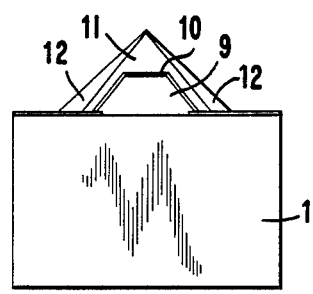
FIG. 4 is a sectional view of a 45° mirror reflective face formed on a narrow region after the selective epitaxy process by the method of the present invention.
Figure 5:
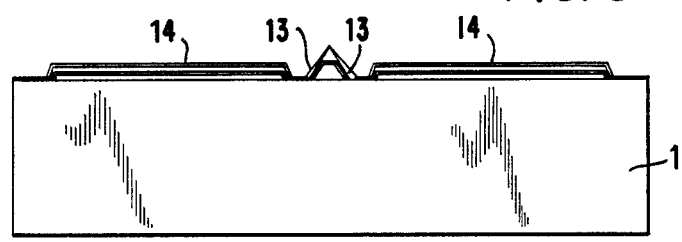
FIG. 5 is a sectional view showing a 45° mirror reflective face and a LASER diode formed simultaneously by a selective epitaxy process of the present invention.

In case of carrying out the selective epitaxy process as thus, the shape of the laminated crystal on the region for forming the 45° mirror reflective face surrounded by the mask 6 is as shown in FIG. 4. That is to say, at the initial stage of the crystal lamination the crystal is of a trapezoidal shape 9 crystallographically, and when the crystal lamination is advanced for a long term the top edge of the trapezoidal shape 9 is gradually diminished and becomes a triangular shape 11. However, since the angle between the triangular shape 11 and the substrate 1 is crystallographically fixed to about 54°, it is not suitable for the 45° mirror reflective face. But, because AlGaAs is far more solid than GaAs in their properties in case that the triangular layer 11 is a layer of AlGaAs and a layer of GaAs is laminated on the triangular layer 11 a masstransport occurs during the epitaxy process, and thus the GaAs layer is collapsed and the triangular shape 11 becomes to be converted into a gentle triangular shape 12. Accordingly, a triangular shape 12 having an angle of 45° can be obtained by controlling the collapsing rate of the triangular shape 12 of GaAs on the triangular shape 11 of AlGaAs during the epitaxy process. Thus, in case of such a selective epitaxy process, the rate of crystal lamination varies to a large degree by the area of the region that the crystal is laminated and is surrounded with the mask. When the area of the region of the 45° mirror reflective face is far smaller than that of the region of the LASER diode 8 (more than about 100 times), the rate of crystal lamination of the region of 45° mirror reflective face 7 is increased extraordinarily than that of the region of LASER diode 8, so that during a general double heterogeneous junction being accomplished on the region of the LASER diode 8, a 45° mirror reflective face already becomes to start to be formed on the region of the mirror reflective face 7. In FIG. 5 the 45° mirror reflective face 13 formed on a narrow region through such processes and the shape of two LASER diodes 14 laminated on both sides of the mirror reflective face 13 are shown.

As described above, in the embodiment of the present invention the 45° mirror reflective face 13 and the LASER diodes 14 can be simultaneously formed by the epitaxy process itself, and accordingly there is no need for the photoetching.

Figure 1D:
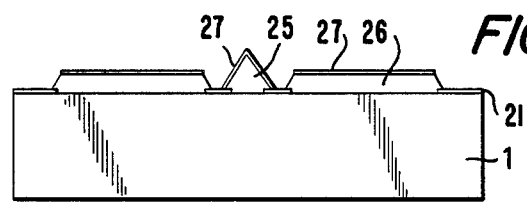
Figure 1E:
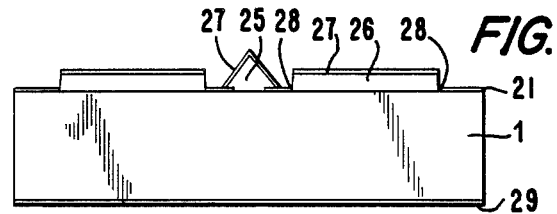

And thus, after forming the 45° mirror reflective face 25 and the LASER diodes 26 through the epitaxy process as shown in FIG. 1C, a p-type metal layer 27 is deposited only on the 45° mirror reflective face 25 and the LASER diode 26 by making use of the photolithography method as shown in FIG. 1D. Thereafter, as shown in FIG. 1E a slant face of the LASER diode 26 is converted into a vertical face 28 with chemical reagents such as $H_2SO_4:H_2O_2:H_2O$ by making the deposited p-type metal layer 27 as a mask, and a n-type metal layer 29 is deposited after grinding a crystal laminated face of the n-type single crystal GaAs substrate 1 and the opposite face so that the whole thickness thereof becomes to about 100 μm, and then a heat treatment is carried out to complete the manufacturing process.

Figure 6:
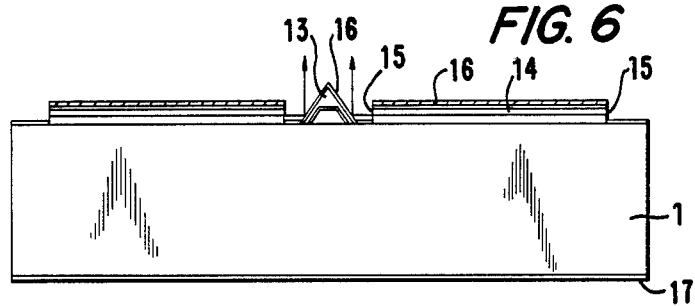
FIG. 6 is a sectional view showing a complete shape of a surface emitting type semiconductor LASER diode according to the present invention.

In such a emitting type AlGaAs/GaAs semiconductor LASER diode, the LASER beam is emitted from an active layer of an edge type LASER diode, as shown in FIG. 6 in an arrow, and is collided to the 45° mirror reflective face to emit to the surface.

As described above in detail, according to the present invention it is possible to manufacture a surface emitting type semiconductor LASER diode by forming naturally the 45° mirror reflective face during the epitaxy process in manufacturing a surface emitting type AlGaAs/GaAs semiconductor LASER diode, thereby the manufacturing process can be simplified and the enhancement of the productivity can also be obtained.

What is claimed is:

1. A method for manufacturing a surface emitting type AlGaAs/GaAs semiconductor LASER diode by a selective epitaxy process comprising the following steps of:
    forming a silicon oxide layer or a silicon nitride layer on one side of a n-type single crystal GaAs substrate so as to be a mask;
    removing said mask of regions each for forming a 45° mirror reflective face and a LASER diode by making use of a photolithography method and a chemical etching method;
    forming a triangular 45° mirror reflective face and a LASER diode by removing the photoresistor on the remaining mask after a selective epitaxy process and depositing a p-type metal layer on those layers;
    forming a slant face of the LASER diode into a vertical face under the state of said p type metal layer being made as a mask; and
    depositing a n-type metal layer on the other side of the n-type single crystal GaAs substrate, thereafter carrying out a heat treatment.

2. The method as claimed in claim 1, wherein the width of the 45° mirror reflective face is 10–50 μm, and the width of the region for forming the LASER diode is 200–1000 μm.

3. The method as claimed in claim 1, wherein the angle of the mirror reflective face is obtained by making use of a mass-transport of a GaAs layer on a triangular AlGaAs layer during an epitaxy process when manufacturing the triangular 45° mirror reflective face by the selective epitaxy process.

* * * * *